United States Patent [19]
Jefferson et al.

[11] Patent Number: 6,115,312
[45] Date of Patent: Sep. 5, 2000

[54] PROGRAMMABLE LOGIC DEVICE MEMORY CELL CIRCUIT

[75] Inventors: David E. Jefferson; Bruce B. Pedersen, both of San Jose, Calif.

[73] Assignee: Altera Corporation, San Jose, Calif.

[21] Appl. No.: 09/167,637

[22] Filed: Oct. 6, 1998

Related U.S. Application Data
[60] Provisional application No. 60/062,063, Oct. 16, 1997.

[51] Int. Cl.[7] .................................................. G11C 7/00
[52] U.S. Cl. ...................... 365/228; 365/200; 365/225.7; 365/226
[58] Field of Search ..................................... 365/154, 156, 365/200, 228, 233.5, 225.7, 226, 190

[56] References Cited

U.S. PATENT DOCUMENTS

| | | | |
|---|---|---|---|
| 4,780,847 | 10/1988 | Ito | 365/154 |
| 4,928,266 | 5/1990 | Abbott et al. | 365/189.01 |
| 5,018,102 | 5/1991 | Houston | 365/95 |
| 5,307,319 | 4/1994 | Kohketsu et al. | 365/230.08 |
| 5,313,430 | 5/1994 | Rawlins et al. | 365/229 |
| 5,604,453 | 2/1997 | Pederson | 327/112 |
| 5,652,730 | 7/1997 | Kono et al. | 365/226 |
| 5,671,179 | 9/1997 | Javanifard | 365/185.33 |
| 5,696,455 | 12/1997 | Madurawe | 326/41 |
| 5,768,207 | 6/1998 | Raad et al. | 365/226 |
| 6,041,000 | 5/2000 | McClure et al. | 365/200 |

FOREIGN PATENT DOCUMENTS

0 523 995 A1  1/1993  European Pat. Off. .......... G11C 7/00

*Primary Examiner*—Richard Elms
*Assistant Examiner*—Hien Nguyen
*Attorney, Agent, or Firm*—Fish & Neave; Robert R. Jackson; G. Victor Treyz

[57] ABSTRACT

A memory cell circuit for a programmable logic device is provided that allows groups of memory cells to be powered down when one or more of the memory cells in a group is defective. Each memory cell contains two cross-coupled inverters for storing programming data for the programmable logic device. A first inverter in each cell is powered by a global power signal. A second inverter in each cell is powered by a power supply signal. The memory cells are powered down by taking the global power signal low while maintaining the power supply signal high. Because the second inverter remains active during power down, the memory cells may be shut down completely. The memory cell circuit may be used to set all of the memory cells to a known state upon power up.

15 Claims, 6 Drawing Sheets

PROGRAMMABLE LOGIC DEVICE MEMORY CELL CIRCUIT

This application claims the benefit of U.S. provisional application Ser. No. 60/062,063, filed Oct. 16, 1997.

BACKGROUND OF THE INVENTION

This invention relates to programmable logic devices. More particularly, this invention relates to circuitry for powering down groups of memory cells in a programmable logic device and for resetting the states of the memory cells in a programmable logic device upon device initialization.

Programmable logic devices are integrated circuits that may be programmed by a user to perform various logic functions. Some programmable logic devices are based upon random access memory cells that may be loaded with programming data to configure the programmable logic components contained in such devices. Memory cells in a device of this type are often organized in the form of an array of rows and columns of cells.

In programmable logic devices based on programmable memory cells, it is sometimes necessary to deactivate a row of cells. For example, if a defective memory cell is found in a row during device testing, that row of cells may be removed from active use by powering down the cells in the row. However, conventional circuits for deactivating rows of memory cells are not always capable of completely shutting down the memory cells.

In addition, to properly initialize a programmable logic device, all of its memory cells must be placed in a known state. This is typically done by programming a zero into each memory cell. However, maintaining the ability to program each cell with a zero after power has been applied to the device imposes restrictions on the minimum power supply level (Vcc) that may be used. If Vcc is too low, it will be difficult to program the device properly. Although a large value of Vcc may be used, this increases power consumption.

It is therefore an object of the present invention to provide a programmable logic device memory array circuit that allows a group of memory cells to be powered down and that allows the memory cells on a device to be effectively reset by maintaining the cells at a logical zero during device initialization.

SUMMARY OF THE INVENTION

This and other objects of the invention are accomplished in accordance with the principles of the present invention by providing a programmable logic device memory circuit that may be used to power down a group of memory cells on a programmable logic device that are connected to a common global power line. The memory cells store programmable logic device programming data that is used to configure the programmable logic device for performing user-selected logic operations. Each cell contains a pair of cross-coupled inverters for storing data. A first inverter in each cell is powered by a global power signal provided via the global power line. A second inverter in each cell is powered by a separate power supply signal.

When a manufacturer determines during testing that one or more of the memory cells associated with a given global power line are defective, the manufacturer directs the programmable logic device memory circuit to power down that global power line (e.g., the manufacturer may set a fuse or other programmable component to a predetermined value). This drives the output of the first inverter to a logical low. Because the second inverter remains active due to its independent source of power (i.e., the power supply signal rather than the global power signal), the second inverter inverts the logical low at the output of the first inverter and applies a logical high to the input of the first inverter. This drives the output of the first inverter completely to ground potential, thereby completely shutting down the cell and isolating it from the remainder of the programmable logic device. All cells connected to the same global power line are shut down simultaneously.

The programmable logic device memory cell circuit may also be used to place the memory cells in a known state as the programmable logic device is powered up. The power up procedure involves applying a ramped power supply voltage to power control logic. The anufacturer sets a fuse to a predetermined state which etermines whether or not the power control logic is responsive to the ramped power supply signal. For example, if the fuse is set high ("power down" mode), the power control logic powers down the memory cells and is not responsive to the ramped power supply signal. If the fuse is set low ("reset" and "normal" modes), the power control logic maintains the global power signal at a logic low as the power supply signal is initially ramped up. This ensures that the memory cells that receive the global power signal are set in a known logical state (i.e., a logical low) during power up. The global power signal is taken high for normal-operation once the device has been initialized.

Further features of the invention and its nature and various advantages will be more apparent from the accompanying drawings and the following detailed description of the preferred embodiments.

DETAILED DESCRIPTION OF THE PREFERRED EMBODIMENTS

Figure 1:
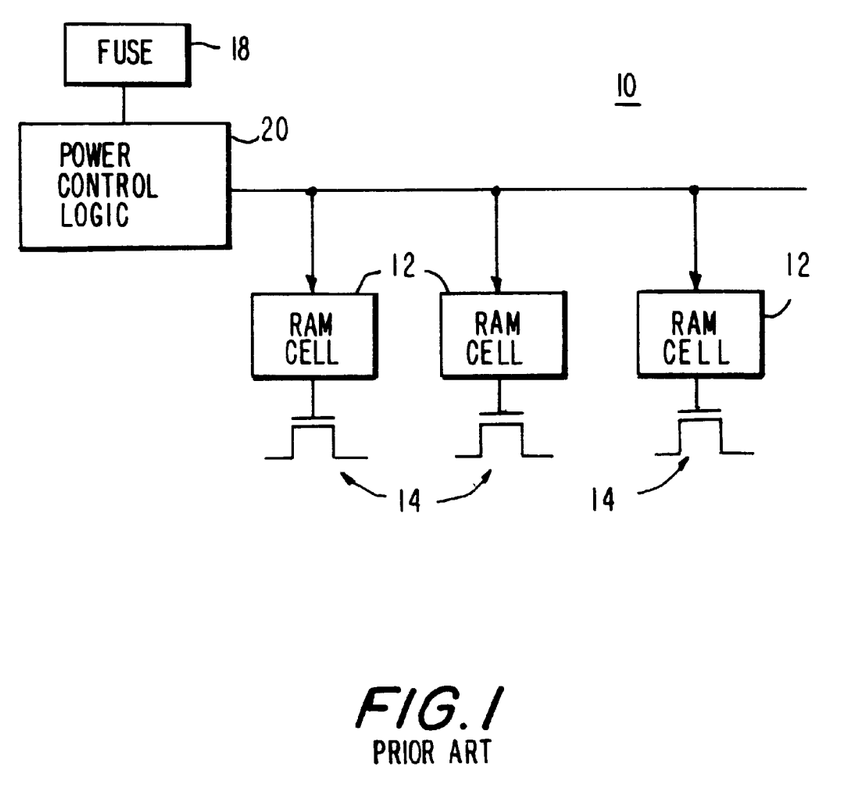
FIG. 1 is a diagram of a conventional programmable logic device memory cell arrangement.

As shown in FIG. 1, conventional programmable logic device memory cell circuitry 10 of the type based on random access memory contains a number of programmable random access memory (RAM) cells 12, each of which drives a transistor 14 or other such component in a configurable logic circuit on a programmable logic device. A user may control the overall logic configuration of the programmable logic device by supplying suitable programming data to memory cells 12. The programming data is stored in memory cells 12 and the value in each cell (a logical one or a logical zero) determines whether the associated transistor 14 is off or on during device operation. Controlling which transistors 14 are on or off controls the logic functions performed by the programmable logic device.

Memory cells 12 are powered in parallel by global power line 16. When a defect is found in one of the memory cells 12 in a row during device testing, the manufacturer of the device can set a fuse such as fuse 18 to a predetermined state (e.g., a logical high). This directs power control logic 20 to take global power line 16 low. Taking global power line 16 low turns off the power supplied to memory cells 12. This isolates the defective memory cell 12 from the rest of the programmable logic device and prevents possible current consumption due to a short circuit in the defective memory cell between global power line 16 and ground (Vss).

Figure 2:
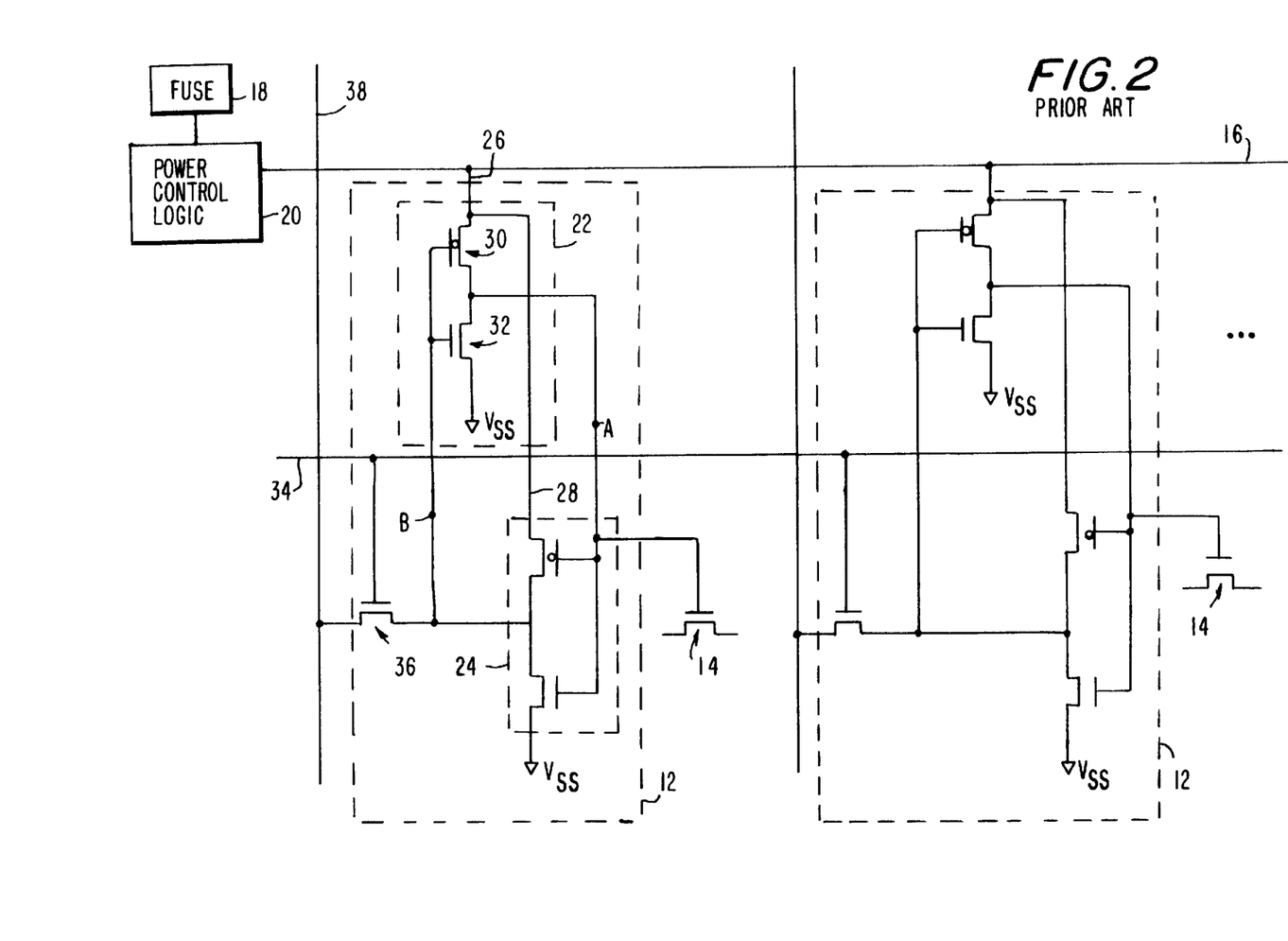
FIG. 2 is a more detailed circuit diagram of the conventional programmable logic device memory cell arrangement of FIG. 1.

The circuit arrangement of FIG. 1 is shown in more detail in FIG. 2. As shown in FIG. 2, each memory cell 12 contains cross-coupled inverters 22 and 24. During operation, both inverter 22 and inverter 24 receive a power supply voltage of Vcc from global power line 16. Inverter 22 receives power at Vcc from global power line 16 via line 26. Inverter 24 also receives power at Vcc from global power line 16 (via line 26 and line 28).

When it is desired to power down the memory cells 12 connected to global power line 16 to remove them from operation (e.g., to isolate a short or other defect), the manufacturer sets fuse 18 to a state that directs power control logic 20 to take line 16 low. As line 16 is taken low, inverter 22 shuts down and the output of inverter 22 at node A is driven toward a logical low. With node A at a permanently low level, memory cell 12 is isolated from the rest of the device. Removing memory cell 12 from operation eliminates excessive current consumption by cell 12 in situations such as when node A is stuck at Vss and shorted to global power line 16. It also prevents cell 12 from inadvertently turning on transistor 14 if node A is shorted to global power line 16.

However, as the voltage on line 26 is driven low in an attempt to isolate cell 14, transistor 30 is turned off. This makes it difficult to drive node A completely to Vss (0). As a result, the voltage at node A never falls below approximately 0.5 V. If inverter 24 were still operating, the logical low at node A would be inverted to a logical high at node B, thereby fully turning on transistor 32 and taking node A completely to Vss (O). However, because line 28 is connected to line 26, the power supply voltage supplied to inverter 24 is taken low at the same time that the power supply voltage supplied to inverter 22 is taken low, which turns off inverter 24.

Another difficulty associated with using the arrangement of FIG. 2 relates to resetting memory cells 12 to a zero state for device initialization. Placing memory cells 12 in a known state is important for proper device operation. If cells 12 are in an unknown state as Vcc is applied during device power up, Vcc can be drawn down just as it rises above the threshold for normal operation and the device begins to operate. This may lead to undesirable signal oscillations.

Each cell 12 may be placed in a known state (e.g., a logical zero state) by placing a logical one on node B, thereby taking node A high and storing a logical one in the cell. A logical one may be place on node B by taking the address line 34 associated with the cell 12 high to turn on transistor 36 while supplying a logical one on the associated data line 38. However, the output of inverter 24 at node B is not easily over-driven at low values of Vcc, which imposes a design limit on the minimum acceptable value of Vcc that may be used for a programmable logic device containing memory cells such as memory cell 12.

Figure 3:
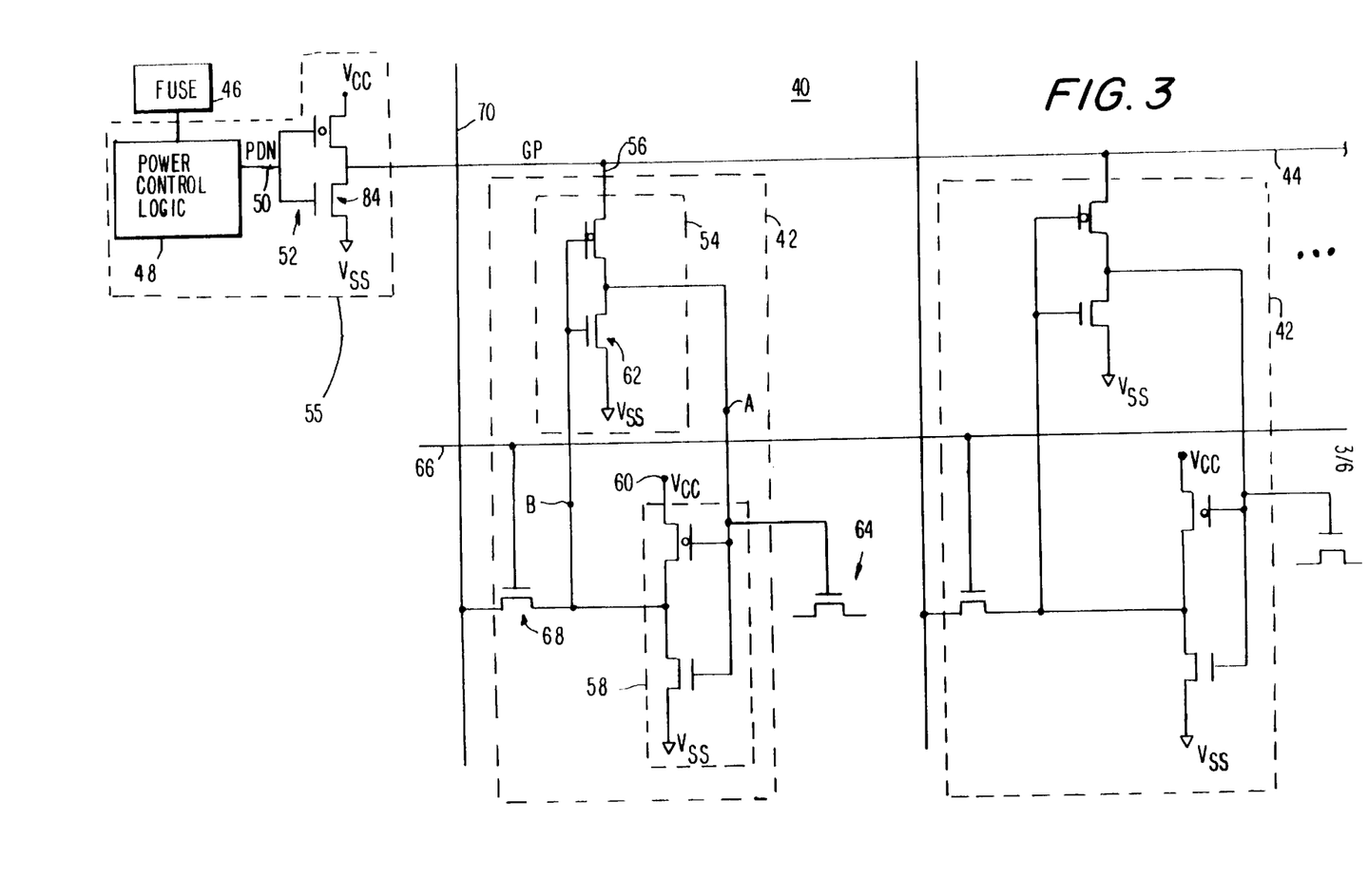
FIG. 3 is a circuit diagram of illustrative programmable logic device memory cell circuitry in accordance with the present invention.

Programmable logic device memory cell circuitry 40 in accordance with the present invention is shown in FIG. 3. Circuitry 40 of FIG. 3 is contained in a programmable logic device. Memory cells 42 are powered by a common global power line 44. Each memory cell 42 has a pair of cross-coupled inverters: inverter 54 and inverter 58. If desired, memory cells such as memory cells 42 may be arranged in rows and columns, each row being powered by a separate global power line 44. Such an arrangement is merely illustrative and any other suitable arrangement in which different groups of memory cells are connected to different global power lines 44 may be used. To avoid over-complicating the drawings, such additional groups of memory cells 42 and associated global power lines 44 and power control circuitry are not shown more than once in FIG. 3.

If a defect is detected in one or more of the memory cells 42 associated with a given global power line 44 during device testing, the manufacturer may isolate that group of cells 42 from the device by taking the global power line 44 for that group low. This places the group of cells 42 in "power down" mode.

Cells 42 may be placed in "power down" mode by setting fuse 46 high to direct power control logic 48 to generate a corresponding high PDN signal on line 50. (Fuse 46 may be a fuse, antifuse, a random access memory cell, or any other suitable type of programmable logic component.) The high PDN signal is inverted by inverter 52 (which with power control logic 48 makes up power control circuitry 55) to produce a low global power signal on global power line 44. Taking global power line 44 low causes the power supplied to inverter 54 of cell 42 via line 56 to drop from a nominal value of full Vcc toward a logical zero value. Turning off inverter 54 in this way causes the output of inverter 54 at node A to fall toward Vss (i.e., ground potential or 0). Because inverter 58 is independently supplied with a power supply signal at nominal Vcc at terminal 60 (e.g., from power supply source 72 of FIG. 4), inverter 58 remains active as the voltage at node A drops. When the voltage at node A has dropped to a logical low value, inverter 58 inverts the logic low on node A to generate a corresponding logic high signal on node B. The logic high on node B turns transistor 62 of inverter 54 on, thereby driving node A completely to Vss (i.e., ground potential or 0).

Because the arrangement of cell 42 allows defective cells 42 to be shut down completely when global power line 44 is taken low (e.g., to avoid current consumption in situations in which node A is stuck at Vss and shorted to global power line 44 and to avoid turning on programmable logic component transistors such as transistor 64 when node A is shorted to global power line 44), the circuit arrangement of FIG. 3 is more effective at power down operations than the circuit arrangement of FIG. 2.

Circuitry 40 also allows the memory cells 42 to be maintained in a known (i.e., zero) state during the process of powering up the programmable logic device in which circuitry 40 is contained. This effectively allows all of the memory cells 42 on the device to be set to zero without requiring that the manufacturer perform the more difficult task of resetting cells 42 by overdriving inverters 58 with a logical one (i.e., by taking each address line 66 at the gate of transistor 68 high to turn on transistor 68 an allow signals to pass between its drain and source terminals while a logical one is provided to each cell 42 on its associated data line 70).

The magnitude of Vcc that is used on the device can therefore be reduced to lower power consumption.

Figure 4:
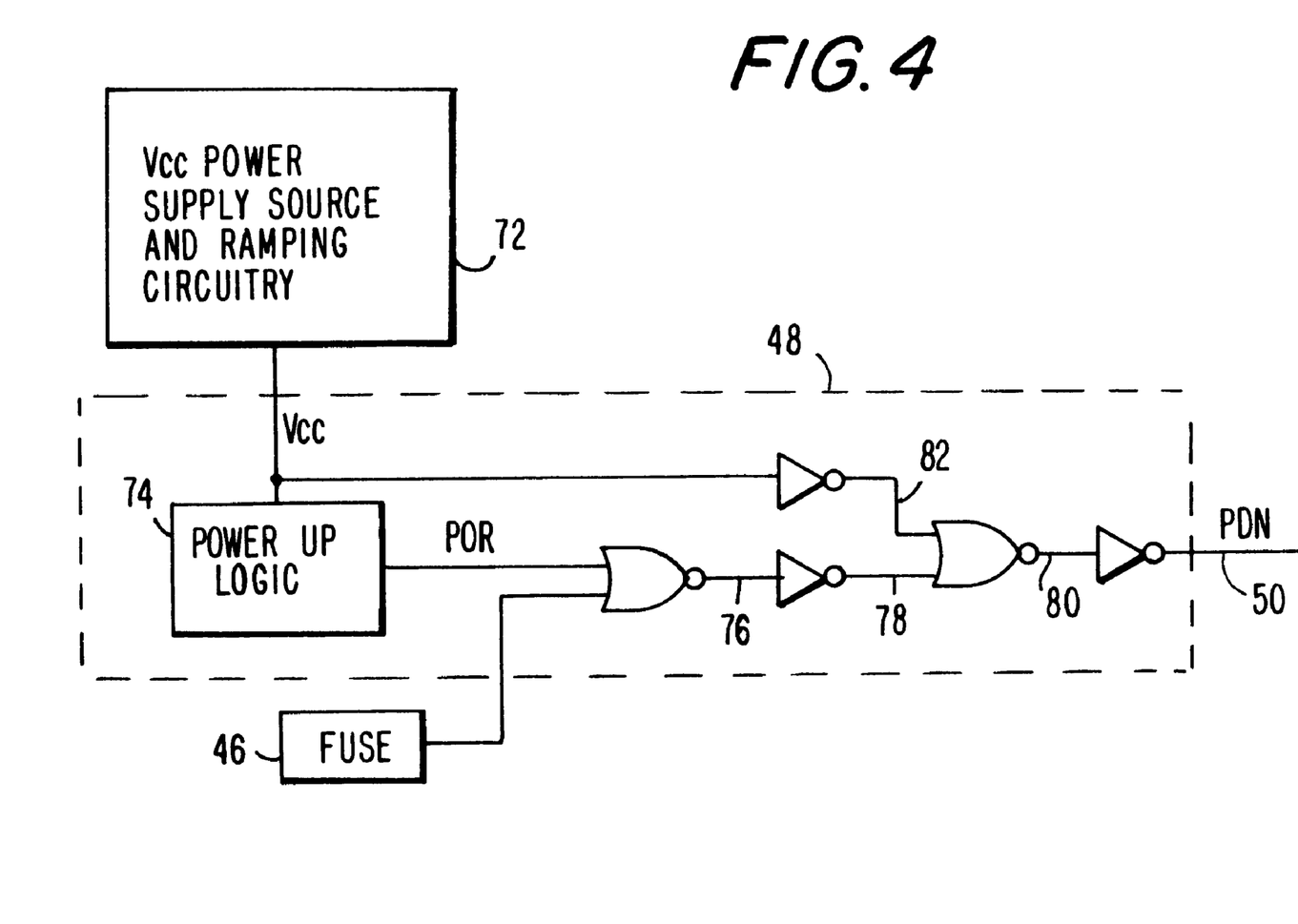
FIG. 4 is a circuit diagram of illustrative power control circuitry for use with the memory cell circuitry of FIG. 3.
Figure 5A:
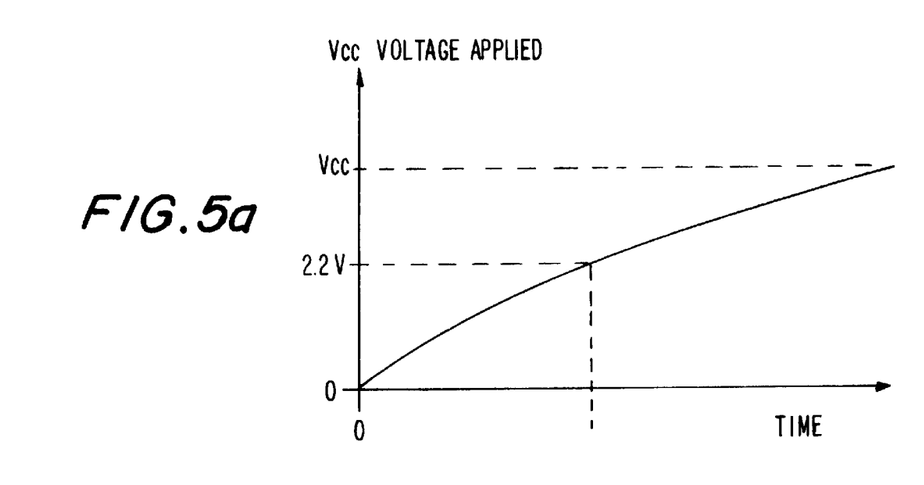
FIG. 5a is a graph showing how the magnitude of applied power supply voltage (Vcc) for a programmable logic device may vary as a function of time and FIG. 5b is a graph showing the resulting power-on-reset (POR) signal level produced by the power up logic of FIG. 4.

A suitable circuit arrangement with which power control logic 48 may maintain memory cells 42 in a known state during the process of powering up a programmable logic device is shown in FIG. 4. For "reset" mode, the manufacturer sets fuse 46 to a logical low value, so that power control logic 48 is responsive to a power-on-reset (POR) signal supplied by power up logic 74. On device initialization, Vcc power supply source and ramping circuitry 72 ramps the magnitude of applied Vcc as shown in FIG. 5a.

Figure 5B:
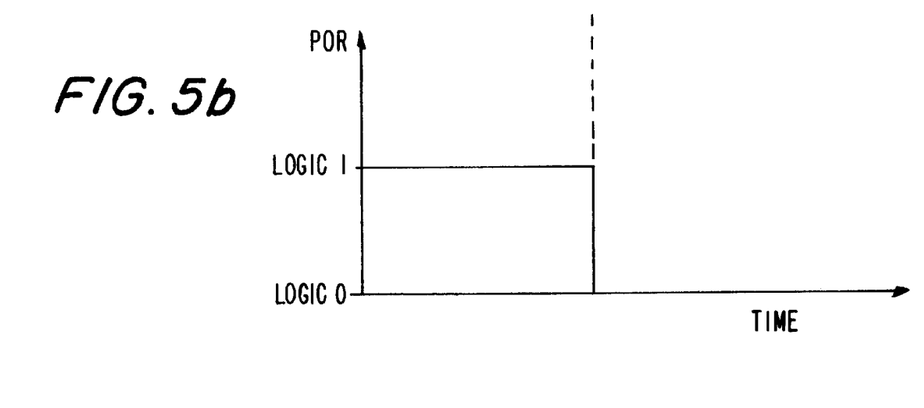

For low values of applied Vcc, POR is high, as shown in FIG. 5b. In this situation, the signal on line 76 is low, and the signal on line 78 is high, the signal on line 80 is low, and the PDN signal on line 50 is sufficiently high to turn on transistor 84 of inverter 52 (FIG. 3) and thereby maintain the signal on global power line 44 of FIG. 3 at Vss. As applied Vcc rises, node A in each cell 42 of FIG. 3 rises to a p-channel threshold voltage above Vss, which is just below the voltage level at which inverter 58 turns on. The inverter 58 in each cell 42 maintains the node B of that cell at Vcc (i.e., a logical high) during the rest of the power up procedure, thereby effectively resetting each cell 42 to a logic low.

When Vcc reaches a predetermined threshold value above which logic on the programmable logic device should operate normally, the signal on line 82 of FIG. 4 goes low. Signal POR also goes low, as shown in FIG. 5b. This causes the signal on line 76 to go high, the signal on line 78 to go low, the signal on line 80 to go high, the signal on line 50 to go low, and the signal on global power line 44 of FIG. 3 to rise to a high logic level (i.e., Vcc). With nominal Vcc applied to all cells 42, the programmable logic device may be used normally, with each cell 42 preset to a known logical zero state.

In "normal" mode, fuse 46 remains low and cells 42 operate like conventional cross-coupled inverter random-access memory cells. Each cell 42 may store data (i.e., a logical one or a logical zero) and may drive data onto data lines 70. In the "normal" and "power down" modes, Vcc power supply source and ramping circuitry 72 supplies a nominal Vcc power supply voltage. This power supply signal is provided to inverters 58 in "power down" mode and to inverters 54 and 58 in "normal" mode.

Figure 6:
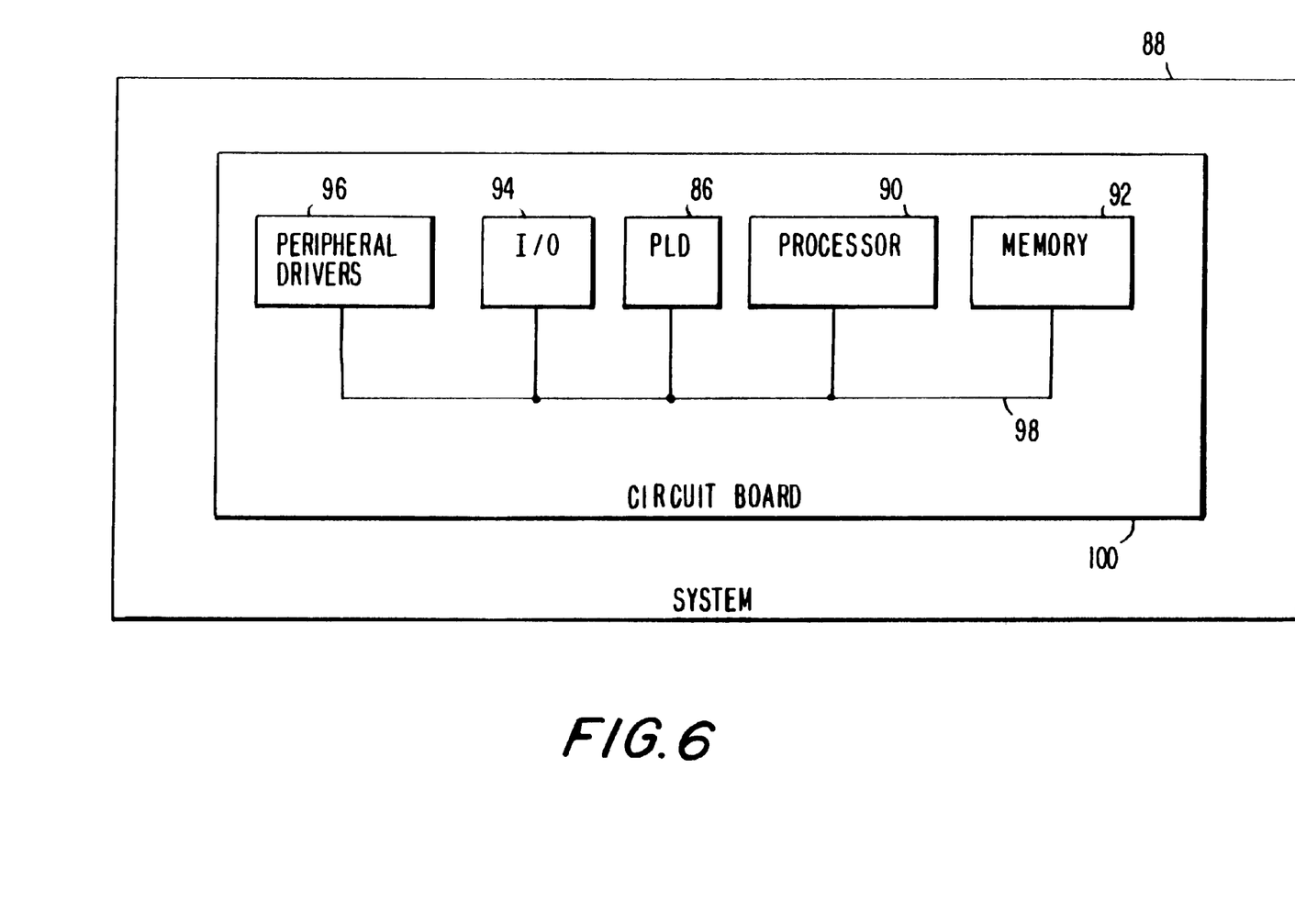
FIG. 6 is a diagram of a system in which a programmable logic device having the memory cell circuit of the present invention may be used.

The foregoing arrangements are typically used in programmable logic devices that are made part of larger systems. FIG. 6 shows a programmable logic device 86 containing the redundancy circuitry of this invention in use in a digital data processing system 30 88. Data processing system 88 may include one or more of the following components: a processor 90, memory 92, I/O circuitry 94, and peripheral drivers 96. These components are coupled together by a system bus 98 and populate a circuit board 100 that is contained in system 88.

System 88 may be used in a wide variety of applications, such as computer networking, data networking, instrumentation, video processing, digital signal processing, or any other application where the advantage of using programmable logic is desirable. Programmable logic device 86 may be used to perform a variety of different logic functions. For example, programmable logic device 86 may be configured as a processor or controller that works in cooperation with processor 90. Programmable logic device 86 may also be used as an arbiter for arbitrating access to a shared resource in system 88. In yet another example, programmable logic device 86 may be configured as an interface between processor 90 and one of the other components in system 88.

The programmable connections made between various components in the programmable logic devices of the present invention can be implemented in any of a wide variety of ways. For example, each programmable connection can be a relatively simple programmable connector such as a switch or a plurality of switches for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connection can use product term logic, implementing functions such as AND, NAND, OR, or NOR. Examples of components suitable for implementing programmable connections are erasable programmable read-only memories (EPROMs), electrically-erasable programmable read-only memories (EEPROMs), pass transistors, transmission gates, antifuses, laser fuses, metal optional links, etc. These programmable components may be controlled by various programmable function control elements or memory cells, which store the configuration data used to control the programmable components and various programmable logic circuits. Examples of suitable function control elements include static random-access memory (SRAM) cells, dynamic random-access memory (DRAM) cells, first-in first-out cells, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

The foregoing is merely illustrative of the principles of this invention and various modifications can be made by those skilled in the art without departing from the scope and spirit of the invention.

What is claimed is:

1. A programmable logic device memory cell circuit that receives a power supply signal from a power supply source, comprising:

a plurality of memory cells for storing programmable logic device programming data;

a global power line connected to the memory cells;

power control circuitry for supplying a global power signal to the global power line and for powering down the memory cells by reducing the magnitude of the global power signal;

a first inverter in each memory cell that is powered by the global power signal from the global power line and that is grounded at a ground potential, the first inverter producing a logical low at its output when the power control logic circuitry reduces the magnitude of the global power signal; and a second inverter in each memory cell that is powered by the power supply signal, the first and second inverters being cross-coupled so that the output of the first inverter is provided as an input to the second inverter and the second inverter has an output that is provided as an input to the first inverter, the second inverter inverting the logical low produced at the output of the first inverter when the power control circuitry powers down the memory cells and applying a corresponding logical high signal to the input of the first inverter, the logical high signal at the input of the first inverter causing the output of the first inverter to be driven completely to the ground potential.

2. The programmable logic device memory cell circuit defined in claim 1 further comprising a plurality of global power lines, each connected to a different group of memory cells.

3. The programmable logic device memory cell circuit defined in claim 1 further comprising:

an address line;

a data line; and a transistor having drain and source terminals connected between the data line and the output of the second inverter and having a gate terminal connected to the address line.

4. A programmable logic device memory cell circuit for placing memory cells in a known state upon power up using a power supply signal from a power supply source and ramping circuit that is ramped up upon device power up, comprising:

a plurality of memory cells for storing programmable logic device programming data, each memory cell containing cross-coupled first and second inverters connected so that the output of the first inverter is received as an input to the second inverter and the output of the second inverter is received as an input to the first inverter, the second inverter in each memory cell being powered by the power supply signal;

a global power line connected to the memory cells; and power control circuitry configured to receive the power supply signal and configured to apply a corresponding global power signal to each of the first inverters via the global power line during power up, wherein the power control circuitry initially holds the global power signal during ramp up at a first logical value that maintains the output of the first inverter at the first logical value so that the output of the second inverter is driven to a second logical value, and wherein the power control circuitry subsequently takes the global power signal to the second logical value so that the memory cells operate normally and are in a known logical state.

5. The programmable logic device memory cell circuit defined in claim 4 wherein the first logical value is a logical low, the second logical value is a logical high, and the known logical state is a logical low.

6. The programmable logic device memory cell circuit defined in claim 4 further comprising a programmable logic component that is programmable to configure whether the power control circuitry is responsive to the ramped up power signal.

7. The programmable logic device memory cell circuit defined in claim 4 wherein the power control circuitry further comprises:

power up logic configured to receive the power supply signal during power up and to provide a corresponding power-on-reset signal;

a programmable logic component that is programmable to configure whether the power control circuitry is responsive to the power supply signal as it is ramped up; and logic circuitry for receiving the power-on-reset signal, an output signal from the programmable logic component, and the power supply signal and for providing the global power signal in response.

8. A digital processing system comprising:

a processor;

a memory coupled to the processor; and a programmable logic device coupled to the processor and the memory, the programmable logic device having a programmable logic device memory cell circuit that receives a power supply signal from a power supply source and that has:

a plurality of memory cells for storing programmable logic device programming data;

a global power line connected to the memory cells;

power control circuitry for supplying a global power signal to the global power line and for powering down the memory cells by reducing the magnitude of the global power signal;

a first inverter in each memory cell that is powered by the global power signal from the global power line and that is grounded at a ground potential, the first inverter producing a logical low at its output when the power control logic circuitry reduces the magnitude of the global power signal; and a second inverter in each memory cell that is powered by the power supply signal, the first and second inverters being cross-coupled so that the output of the first inverter is provided as an input to the second inverter and the second inverter has an output that is provided as an input to the first inverter, the second inverter inverting the logical low produced at the output of the first inverter when the power control circuitry powers down the memory cells and applying a corresponding logical high signal to the input of the first inverter, the logical high signal at the input of the first inverter causing the output of the first inverter to be driven completely to the ground potential.

9. The digital processing system defined in claim 8 further comprising a circuit board on which the memory, the processor, and the programmable logic device are mounted.

10. The digital processing system defined in claim 8 further comprising input/output circuitry coupled to the programmable logic device, the processor, and the memory.

11. The digital processing system defined in claim 8 further comprising peripheral drivers coupled to the programmable logic device, the processor, and the memory.

12. A digital processing system comprising:

a processor;

a memory coupled to the processor; and a programmable logic device coupled to the processor and the memory, the programmable logic device having a programmable logic device memory cell circuit for placing memory cells in a known state upon power up using a power supply signal from a power supply source and ramping circuit that is ramped up upon device power up, the programmable logic device memory cell circuit having:

a plurality of memory cells for storing programmable logic device programming data, each memory cell containing cross-coupled first and second inverters connected so that the output of the first inverter is received as an input to the second inverter and the output of the second inverter is received as an input to the first inverter, the second inverter in each memory cell being powered by the power supply signal;

a global power line connected to the memory cells; and power control circuitry configured to receive the power supply signal and configured to apply a corresponding global power signal to each of the first inverters via the global power line during power up, wherein the power control circuitry initially holds the global power signal during ramp up at a first logical value that maintains the output of the first inverter at the first logical value so that the output of the second inverter is driven to a second logical value, and wherein the power control circuitry subsequently takes the global power signal to the second logical value so that the memory cells operate normally and are in a known logical state.

13. The digital processing system defined in claim 12 further comprising a circuit board on which the memory, the processor, and the programmable logic device are mounted.

14. The digital processing system defined in claim 12 further comprising input/output circuitry coupled to the programmable logic device, the processor, and the memory.

15. The digital processing system defined in claim 12 further comprising peripheral drivers coupled to the programmable logic device, the processor, and the memory.

* * * * *